United States Patent
Bao et al.

(10) Patent No.: US 7,045,470 B2
(45) Date of Patent: May 16, 2006

(54) METHODS OF MAKING THIN DIELECTRIC LAYERS ON SUBSTRATES

(75) Inventors: Zhenan Bao, Millburn, NJ (US); Howard Edan Katz, Summit, NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 10/701,185

(22) Filed: Nov. 4, 2003

(65) Prior Publication Data

US 2005/0093107 A1    May 5, 2005

(51) Int. Cl.
*H01L 21/31*      (2006.01)
*H01L 21/469*     (2006.01)
*H01L 21/3205*    (2006.01)
*H01L 21/4963*    (2006.01)
*H01L 21/336*     (2006.01)

(52) U.S. Cl. ............... 438/762; 438/761; 438/763; 438/591; 438/287

(58) Field of Classification Search .......... 438/761, 438/762, 763, 591, 287
See application file for complete search history.

(56) References Cited

U.S. PATENT DOCUMENTS

| | | | |
|---|---|---|---|
| 4,420,497 A * | 12/1983 | Tickle | ............ 438/466 |
| 4,471,036 A | 9/1984 | Skotheim | |
| 5,347,144 A | 9/1994 | Garnier et al. | |
| 5,625,199 A | 4/1997 | Baumbach et al. | |
| 5,731,235 A * | 3/1998 | Srinivasan et al. | ......... 438/253 |
| 5,981,970 A | 11/1999 | Dimitrakopoulos et al. | |
| 6,342,164 B1 * | 1/2002 | Beuhler et al. | ............... 216/39 |

OTHER PUBLICATIONS

Dubois et al., Electrical Properties of Electrochemically Prepared Thin Polyphenylene Oxide Films on a Platinum Surface: The Role of Ionic Impurities in Electroforming and Conduction, Thin Solid Films, 1980, pp. 141-148, vol. 69.

Dubois et al., Electrical Properties of Electrochemically Prepared Thin Polytetrahydrofuran Films I: Characterization Under A.C. Conditions, Thin Solid Films, 1980, pp. 83-90, vol. 65.

Harada et al., Catalytic Amplification of Patterning via Surface-Confined Ring-Opening Metathesis Polymerization on Mixed Primer Layers Formed by Contact Printing, Langmuir, 2003, pp. 5104-5114, vol. 19, No. 12.

Katz et al., Electrical Properties of Multilayers Based on Zirconium Phosphate/Phosphonate Bonds, Chemistry of Materials, 1993, pp. 1162-1166, vol. 5.

(Continued)

Primary Examiner—Donghee Kang
Assistant Examiner—Samuel A. Gebremariam

(57) ABSTRACT

Apparatus comprising: a first substrate; a dielectric layer comprising a first dielectric material on the first substrate, the dielectric layer having a dielectric layer thickness and being traversed by through holes passing from an interface with the first substrate, to an opposite side of the dielectric layer; and a second dielectric material at least partially blocking the through holes. Methods for making such apparatus.

20 Claims, 4 Drawing Sheets

OTHER PUBLICATIONS

Klauk et al., Pentacene Organic Thin-Film Transistors and ICs, Solid State Technology, Mar. 2000, pp. 63-75, vol. 43, No. 3.

Li et al., Field-Effect Transistors Based on Thiophene Hexamer Analogues with Diminished Electron Donor Strength, Chemistry of Materials, 1999, pp. 458-465, vol. 11.

Mengoli et al., An Overview of Phenol Electropolymerization for Metal Protection, Journal of the Electrochemical Society, Dec. 1987, pp. 643C-652C, vol. 134, No. 12.

Sankarapapavinasam, Kinetics and Mechanism of Electropolymerization of m-Aminophenol, Journal of Polymer Science: Part A: Polymer Chemistry, 1993, pp. 1105-1109, vol. 31.

Sankarapapavinasam, Permeability and Electrocatalytic Properties of Film Prepared by Electropolymerization of m-aminophenol, Synthetic Metals, 1993, pp. 173-185, vol. 58.

Yu et al., Controlled Grafting of Well-Defined Polymers on Hydrogen-Terminated Silicon Substrates by Surface-Initiated Atom Transfer Radical Polymerization, Journal of Physical Chemistry B, 2003, pp. 10198-10205, vol. 107, No. 37.

Zangmeister et al., Selective Deposition of Rod-like Phthalocyanine Aggregates on Au Surfaces Patterned with a Combination of Microcontact Printing and Electropolymerization, Advance Functional Materials, Mar. 2002, pp. 179-186, vol. 12, No. 3.

U.S. Appl. No. 10/700,651, filed Nov. 4, 2003, Katz et al.

* cited by examiner

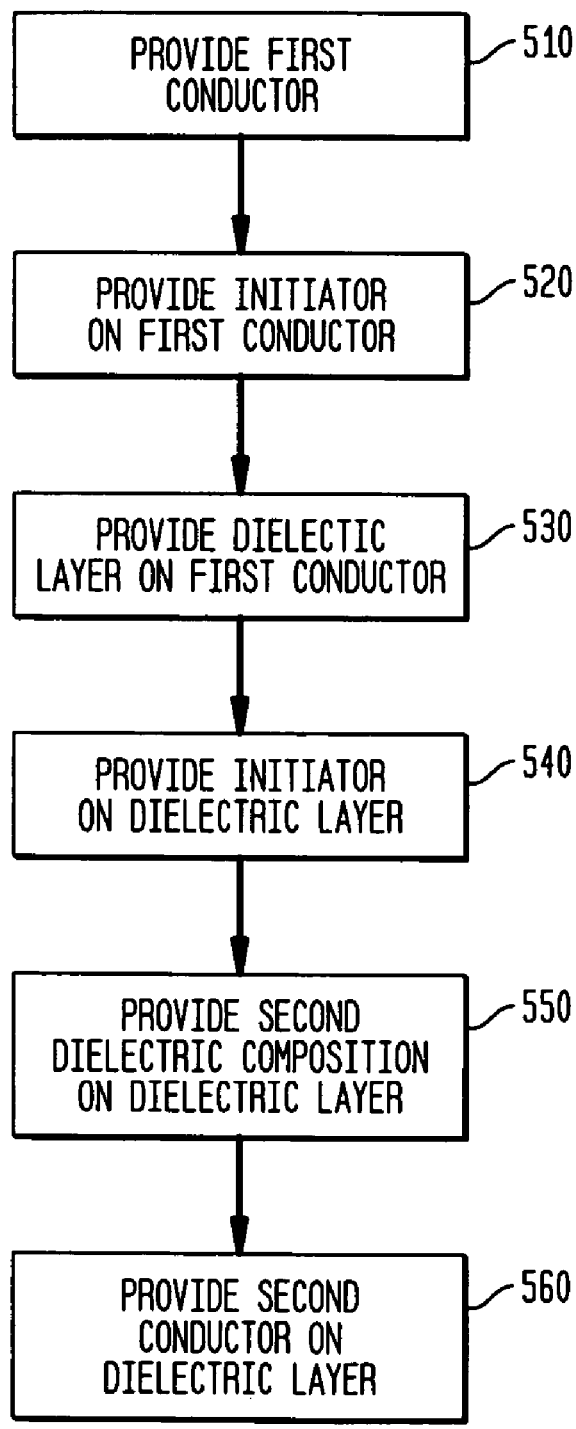

METHODS OF MAKING THIN DIELECTRIC LAYERS ON SUBSTRATES

The U.S. Government has a paid-up license in this invention and the right in limited circumstances to require the patent owner to license others on reasonable terms as provided for by the terms of Advanced Technology Program Cooperative Agreement No. 70NANB2H3032 awarded by the National Institute of Standards and Technology.

FIELD OF THE INVENTION

The present invention relates to dielectric layers on substrates and methods for making them. The present invention further relates to devices incorporating such dielectric layers on substrates and methods for making them.

BACKGROUND OF THE INVENTION

Dielectric films on substrates have many uses. For example, a thin film field effect transistor ("TFET") or other active microelectronic device can be fabricated that incorporates a dielectric film on a conductive substrate. Further, a capacitor can be fabricated that incorporates a dielectric film to isolate two conductive electrodes. In these types of devices and others, the effective dielectric constant and the capacitance of the dielectric film play important roles in determining the overall device performance.

As the thickness of a dielectric film is increased, its capability to act as an insulator also increases. The incidence of pinholes passing completely across the thickness of the dielectric film from one surface to the other ("through holes") also accordingly decreases. However, as the thickness of the dielectric film is increased, the dielectric film's capacitance may decrease. In an exemplary TFET, as the thickness of the dielectric film is increased, the ability of the gate electrode to affect the conductivity of the channel region of the semiconductor is weakened. In an exemplary capacitor, the capacitance of the device decreases as the separation between the two conductive substrate plates increases. Hence, the performance capability of the capacitor in storing an electrical charge decreases.

The desirability of avoiding through holes in dielectric films resulting in charge leakage and shorting, and the desirability of high capacitance, accordingly call for conflicting designs with relatively increased and decreased dielectric film thickness, respectively.

There is a need for dielectric films having a reduced thickness and an accordingly high capacitance, also having a reduced prevalence of through holes.

SUMMARY OF THE INVENTION

In accordance with the present invention, thin films comprising a first dielectric material formed on substrates are provided, having through holes filled by a second dielectric material.

In one embodiment, an apparatus is provided, comprising: a first substrate; a dielectric layer comprising a first dielectric material on the first substrate, the dielectric layer having a dielectric layer thickness and being traversed by through holes passing from an interface with the first substrate, to an opposite side of the dielectric layer; and a second dielectric material at least partially blocking the through holes. In another embodiment, such an apparatus is provided in which the second dielectric material at least partially blocks a mutually adjacent pair of the through holes without forming a continuous layer between the mutually adjacent pair of through holes. In an additional embodiment, such an apparatus is provided in which the dielectric layer comprises pits that produce surface roughness in one surface of the dielectric layer, and wherein the second dielectric material at least partially fills the pits in a manner that reduces the roughness. In a further embodiment, such an apparatus is provided in which the dielectric layer comprises bumps on one surface thereof, and areas surrounding the bumps are at least partially smoothed with the second dielectric material.

In another embodiment, a method of making an apparatus comprising a first substrate and a dielectric layer is provided, comprising the steps of: providing a first substrate; providing a dielectric layer comprising a first dielectric material on the first substrate, the dielectric layer having a dielectric layer thickness and being traversed by through holes passing from an interface with the first substrate, to an opposite side of the dielectric layer; and providing a second dielectric material at least partially blocking the through holes.

A more complete understanding of the present invention, as well as other features and advantages of the invention, will be apparent from the following detailed description and the accompanying drawings.

BRIEF DESCRIPTION OF THE DRAWINGS

The present invention will be better understood from reading the following description of non-limiting embodiments, with reference to the attached drawings below, in which:

FIG. 5 shows an embodiment of a method 500 for making the capacitor shown in FIG. 3.

The drawings of the instant application are not to scale but are merely schematic representations, and thus are not intended to portray the specific dimensions of the invention, which may be determined by skilled artisans through examination of the disclosure herein.

DETAILED DESCRIPTION

The present invention will now be described more fully with reference to the accompanying drawings, in which several embodiments are shown. This invention may, however, be embodied in various forms and should not be construed as being limited to the embodiments set forth herein. Rather, these embodiments are provided so that this disclosure will fully convey the scope of the invention to those skilled in the art.

In accordance with the present invention, thin films formed on substrates from a first dielectric precursor composition are provided having through holes filled by a second dielectric precursor composition. The film formed from the first dielectric precursor composition may have a disordered or ordered structure. Further, exemplary methods are provided for fabricating such dielectric films on substrates, in which the second dielectric precursor composition is directed to be preferentially deposited in the through holes. Embodiments including devices comprising the dielectric films on substrates are also provided, such as TFETs and capacitors for example.

Figure 1:
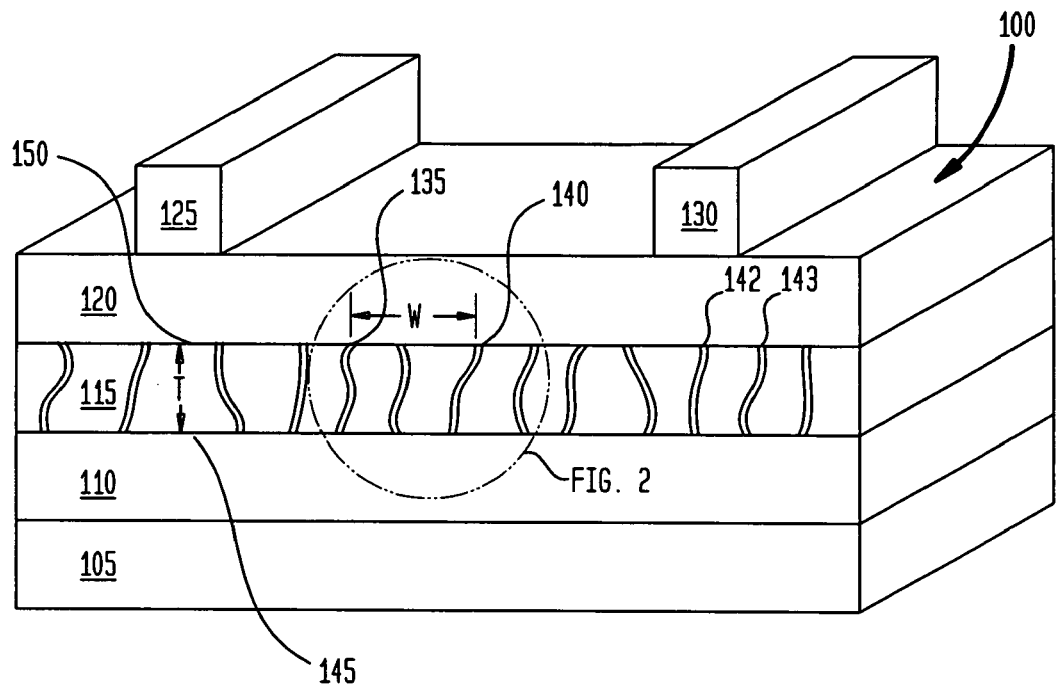
FIG. 1 shows a cross-sectional perspective view of an exemplary TFET 100 fabricated in accordance with the present invention.

FIG. 1 shows a cross-sectional perspective view of an exemplary TFET 100 fabricated in accordance with the present invention. The TFET 100 comprises an insulating substrate 105, a conductive substrate 110, a dielectric layer 115, a semiconductor layer 120, a source electrode 125, and a drain electrode 130.

The conductive substrate 110 overlies and is in contact with the insulating substrate 105. The dielectric layer 115 overlies and is in contact with the conductive substrate 110. The semiconductor layer 120 overlies and is in contact with the dielectric layer 115. The source electrode 125 and the drain electrode 130 overlie and are in contact with the semiconductor layer 120 in a spaced apart relationship. The source electrode 125, the drain electrode 130, and the conductive substrate 110 are in electrical communication with an external circuit, not shown, which can be an integrated circuit for example.

The insulating substrate 105 serves as a structural support for the conductive substrate 110, and electrically isolates the conductive substrate 110. The dielectric layer 115 separates the semiconductor layer 120 from the conductive substrate 110, effectively minimizing a leakage current between the conductive substrate 110 and the semiconductor layer 120 while permitting the conductive substrate 110 to influence the conductivity of the semiconductor layer 120. A current of charge carriers can flow between the source electrode 125 and the drain electrode 130 through the semiconductor layer 120. The conductive substrate 110 serves as a gate electrode that controls the conductivity of the semiconductor layer 120 permitting operation of the TFET 100.

The insulating substrate 105 serves the dual purposes of providing structural support for the conductive substrate 110 and of isolating the conductive substrate 110 to prevent undesired dissipation of an electrical charge to be applied to the conductive substrate 110. The insulating substrate 105 may be fabricated, for example, from a dielectric material such as a silicon wafer having a silicon dioxide coating, or from a Mylar® polyester sheet.

The conductive substrate 110 provides a gate current for controlling the conductivity of the semiconductor layer 120 in operation of the TFET 100. The conductive substrate 110 is fabricated from a conductive material such as a metal, a heavily doped semiconductor, a conductive ceramic, or a conductive polymer. Suitable metals include, for example, aluminum, gold, silver, gallium, indium, platinum, palladium, nickel, titanium, copper, and alloys. Any metal that can, for example, be electroplated, evaporated, cast, electrolessly deposited or sputtered can be used. Conductive ceramics include indium tin oxide, for example. Conductive polymers include, for example, polyaniline and poly(ethylene dioxythiophene), the latter also known as "PEDOT". The conductive substrate 110 may if desired be formed as a thin layer having an insufficient thickness to be self-supporting.

The dielectric layer 115 serves the dual purposes of isolating the semiconductor layer 120 from the conductive substrate 110 to prevent dissipation of an electrical charge to be applied to the conductive substrate 110, and of permitting an electric field applied to the conductive substrate 110 to influence the conductivity of the semiconductor layer 120. The dielectric layer 115 is formed from a first dielectric precursor composition. The dielectric layer 115 may be fabricated from any suitable dielectric precursor composition, such as an inorganic or organic composition. The first dielectric precursor composition may comprise monomeric, oligomeric or polymeric organic materials, or inorganic materials, and blends of the same. The term "blends" as used in this specification broadly encompasses and includes copolymers formed from the corresponding monomers, oligomers, and polymers, mixtures of polymers, and other compositions comprising the same as well as compositions comprising inorganic materials, however produced. In one embodiment, the dielectric layer 115 has a dielectric constant of at least about 2, preferably at least about 4, more preferably at least about 10. Such dielectric constant is unitless and is otherwise referred to as the relative permittivity. In another embodiment, the dielectric layer 115 has a resistivity of at least about $1\times10^8$ ohm centimeters. In another embodiment, the dielectric precursor composition comprises an organic compound that is polymerizable to form a dielectric polymer, such as an imide, acrylate, methacrylate, isocyanate, epoxide, vinylsilane, silsesquioxane, cycloalkene or ethacrylate for example. A suitable dielectric layer 115 can be formed, for example, by surface growth of zirconium biphenyl-4,4'-diphosphonate. See Katz, H. E. et al., Chemistry of Materials, vol. 5, pp. 1162–1166 (1993). Another suitable dielectric layer 115 can be formed, for example, by surface growth of polynorbomenes or polycyclopentadienes and derivatives by ring opening metathesis polymerization, using benzylideneruthenium dichloride complexes, also known as "Grubbs catalysts". These reagents are commercially available from Sigma-Aldrich.

In one embodiment, the first dielectric precursor composition comprises a high dielectric material for the purpose of increasing the overall dielectric constant of the dielectric layer 115 to be produced. In such an embodiment, the high dielectric material may take the form of particulate material suspended in other components, resulting in inhomogeneities in the dielectric layer 115. These inhomogeneities may include through holes, pits and bumps, which are then remediated as described below. Pits are indentations in the surface of the dielectric layer 115; and bumps are protrusions on the surface. Suitable high dielectric materials include, for example, titanium dioxide, barium titanate, strontium titanate, and other mixed oxides comprising titanium, barium, strontium, lanthanum and/or zirconium. See, for example, U.S. patent application Ser. No. 10/700,651 of Howard E. Katz and Ashok J. Maliakal, filed concurrently with this application, entitled "LAYER INCORPORATING PARTICLES WITH A HIGH DIELECTRIC CONSTANT", the entirety of which hereby is incorporated herein by reference.

In another embodiment, the first dielectric precursor composition is selected to be relatively non-reactive with the semiconductor chosen for fabrication of the semiconductor layer 120. In this manner, degradation of the semiconductor layer 120 induced by the dielectric layer 115 can be minimized.

In one embodiment, the dielectric layer 115 is sufficiently thin so that inhomogeneities exemplified by through holes 135 and 140 fully extend across the thickness t from the interface 145 between the conductive substrate 110 and the dielectric layer 115, to the interface 150 between the dielectric layer 115 and the semiconductor layer 120. In this manner, the dielectric layer 115 is sufficiently thin to permit an electric field that is applied to the conductive substrate 110 to more strongly influence the conductivity of the semiconductor layer 120. The dielectric layer 115 accordingly has a high capacitance. However, absent treatment of such through holes, such a dielectric layer 115 also permits transmission of a strong leakage current between interfaces 145 and 150.

Figure 2:
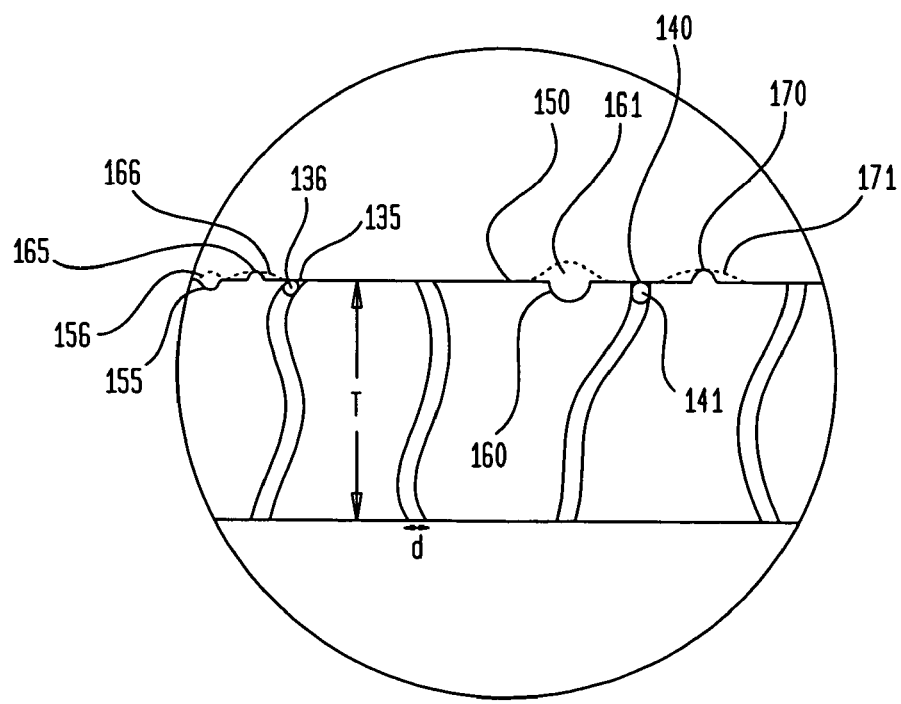
FIG. 2 shows a portion of the TFET of FIG. 1.

FIG. 2 shows a portion of the TFET of FIG. 1 including exemplary pinholes 135 and 140 at the interface 150. Although the exemplary through holes 135 and 140 fully extend across the thickness t, they have an average diameter exemplified by the diameter d that is substantially smaller than the average spacing w shown in FIG. 1 between such through holes. Accordingly, the dielectric layer 115 is a largely continuous material overlying the conductive substrate 110 except for discontinuities such as through holes. In one embodiment, w is at least about 5 times as large as d. In another embodiment, w is at least about 10 times as large as d. Further in this embodiment, a portion of the through holes in the dielectric layer 115, exemplified by through holes 135 and 140, are at least partially blocked by a second dielectric material shown at 136 and 141 respectively. Partial blockage of such through holes in the dielectric layer 115 commensurately reduces the occurrence of a leakage current flowing between the conductive substrate 110 and the semiconductor layer 120. In this manner, the fabrication of a relatively thin dielectric layer 115 is facilitated, because subsequent at least partial blockage of through holes reduces the otherwise resulting excessive leakage current to an acceptable level. Also, a substantially greater density of through holes can thus be tolerated in the first dielectric precursor composition used to fabricate the dielectric layer 115.

In one embodiment, the deposition of the second dielectric material is directed to be localized in the through holes exemplified by through holes 135 and 140. Hence, the second dielectric material frequently is deposited at the interface 150 between the dielectric layer 115 and the semiconductor layer 120 in discrete, discontinuous and mutually isolated regions. For example, the second dielectric material may at least partially block an adjacent pair of exemplary through holes 142 and 143 as shown in FIG. 1 without forming a continuous layer between said adjacent pair of through holes. There is thus no continuous film formed of the second dielectric material. Accordingly, the second dielectric material adds inconsequentially to the overall average thickness t of the dielectric layer 115. By reference to the phrase "localized in the through holes" is broadly meant that the second dielectric material is positioned to effectively reduce the cumulative electrical communication between the conductive substrate 110 and the semiconductor layer 120 via through holes. For example, the second dielectric material may be located in the vicinity of the interface 150 and within, in the entrance to, or over the entrance to a given through hole. FIG. 2 shows that the entrances to the exemplary through holes 135 and 140 are at least partially blocked by plugs 136 and 141 formed from the second dielectric material. By reference to the phrase "at least partially blocked" is meant that some portion of a through hole is obstructed so that the transmission of a leakage current via such through hole is impeded. A given through hole might be completely blocked.

In another embodiment, the deposition of the second dielectric material is directed to fill and smooth out localized rough spots in the dielectric layer 115 exemplified by pits 155 and 160 and by surface bumps 165 and 170. The pits can be filled and areas surrounding the bumps can be smoothed out by depositing the second dielectric material on the pits and around the surface bumps at the interface 150 between the dielectric layer 115 and the semiconductor layer 120 in discrete, discontinuous and mutually isolated regions. FIG. 2 shows exemplary pits 155 and 160 and bumps 165 and 170 at the interface 150 that produce surface roughness in the dielectric layer 115. The pits 155 and 160 are smoothed by plugs 156 and 161 formed from the second dielectric material that at least partially fill the pits in a manner that reduces the roughness, and the areas surrounding the bumps 165 and 170 are at least partially smoothed by tapered deposits 166 and 171 formed from the second dielectric material. Subsequent growth of large single crystals of a semiconductor on the dielectric layer 115 is promoted by increased surface smoothness at the interface 150. Accordingly, larger single crystals of a semiconductor can thus be formed.

In one embodiment, the composition of the second dielectric material to be used is selected from dielectric materials, and precursors to dielectric materials, that can be effectively localized in the through holes. For example, localized deposition of the second dielectric material can be induced by applying an electrical field to the conductive substrate 110, which is transmitted as a leakage current from the interface 145 via the through holes 135 and 140 and selectively reaches the interface 150. In this case, localized deposition of the second dielectric material can occur in the vicinity of the through holes at the interface 145, at the interface 150, and anywhere between such interfaces within such through holes. Alternatively for example, reaction initiators can be provided on the conductive substrate 110 at the interface 145. Following deposition of the dielectric layer 115, exposure of the reaction initiators is limited to localized regions at the interface 145 underlying the through holes. Further, reaction initiators can be applied to the interface 150 overlying the dielectric layer 115 and then selectively deactivated, leaving activated initiators located only near the through holes, pits and bumps. Subsequent deposition of the second dielectric material by any of these exemplary methods accordingly results in selective reaction, such as polymerization, localized in the through holes, on the pits and on areas surrounding the bumps.

Where deposition of the second dielectric material localized in through holes is to be induced by applying an electrical charge to the conductive substrate 110, any monomeric, oligomeric or polymeric dielectric material capable of being attracted by an electrical charge can be used. In one embodiment, the composition of the second dielectric material is provided with charged, oxidizable or reducible moieties in order to magnify the attractive force between the second dielectric material and the through holes.

Where deposition of the second dielectric material localized in the through holes, on the pits and surrounding the bumps is to be induced by reaction initiators, any initiators suitable to induce reactions with the composition selected as the second dielectric material, such as polymerization reactions, can be employed. The initiators are used to initiate reactions such as free radical polymerization, ring opening metathesis, and photo polymerization.

Exemplary precursors for use in producing the second dielectric material include, for example: acetonitrile, tetrahydrofuran, phenol, alkylphenols, hydroxyalkylphenols, allylphenols, phenolamides, phenolamines, styrenes, acrylates, and phenolesters. For example, alpha-bromo-alpha, alpha-dialkylacetate esters are suitable initiators for controlled radical polymerization of styrenes and acrylates in the presence of a copper bromide-4,4'-dinonylbipyridine complex. Further, Grubbs catalysts are suitable for ring opening metathesis polymerization of strained cycloalkenes.

The composition of the semiconductor layer 120 is selected for its capability to provide the desired conductive performance, as well as for its compatibility with the other selected materials as discussed above. The semiconductor may be organic, inorganic, or comprise both organic and inorganic elements. Nanotubes and nanowires can be used.

The semiconductor may be monomeric, oligomeric, or polymeric. In one embodiment, the semiconductor is an acene such as pentacene, for example. In further embodiments, a bithiophene such as 5,5'-bis-(4-ethylphenyl)2,2'-bithiophene or 5,5'-bis-(8-hexylfluorine-1-yl)2,2'-bithiophene is employed as the semiconductor. In additional embodiments, a thiophene such as sexithiophene or a benzothiophene dimer is employed as the semiconductor. Further exemplary thiophene compounds that can be used include: 2,5-linked thiophene tetramers, pentamers, and hexamers, either unsubstituted or substituted at the terminal 5 positions with linear alkyl or alkoxyalkyl chains of about 4 to about 12 atoms in length; anthradithiophene and terminal dialkyl derivatives thereof, including for example dihexylanthradithiophene; regioregular poly (3-hexylthiophene); and co-oligomers of 2,5-linked thiophene rings and 1,4-linked benzene rings about 5 rings long, either unsubstituted or substituted as described for the thiophene oligomers, including for example 1,4-bis(5-(5-hexylthien-2-yl)thien-2-yl)benzene (DHT4Ph). DHT4Ph can be synthesized according to well-known procedures. Exemplary procedures are described for preparing hexylated 5- and 6-ring compounds in W. Li et al, Chem. Mater., Vol. 11, page 458 (1999) (Herein, "Li article"), using 1,4-diiodobenzene as the source of the benzene ring. Other substituted and unsubstituted acenes such as anthracene, pentacene and hexacene for example, other bithiophenes, other thiophenes, phthalocyanines including for example copper phthalocyanine and perfluorinated copper phthalocyanine, naphthalene-1,4,5,8-tetracarboxylic diimide compounds, naphthalene-1,4,5,8-tetracarboxylic dianhydride, and 11,11,12,12-tetracyanonaphtho-2,6-quinodimethane, for example, can also be used. See, for example, Dimitrakopoulos et al. U.S. Pat. No. 5,981,970, Bauntech, et al. U.S. Pat. No. 5,625,199, Garnier, et al. U.S. Pat. No. 5,347,144, and Klauck, Hagen et al., "Deposition: Pentacene organic thin-film transistors and ICs," Solid State Technology, Vol. 43, Issue 3, March 2, pp. 63–75. The entirety of the foregoing patents and Li article cited in this paragraph are hereby incorporated herein by reference in their entirety. Other organic compounds that are capable of transporting charge carriers when formed into a film can also be used.

Exemplary inorganic semiconductors that can be used include elemental silicon, elemental tellurium, gallium arsenide, gallium nitride, indium phosphide, aluminum nitride, indium nitride, gallium antimonide, indium antimonide, aluminum antimonide, aluminum gallium nitride, aluminum gallium arsenide, aluminum gallium antimonide, gallium aluminum antimonide, indium gallium antimonide, gallium arsenic antimonide, indium gallium phosphide, indium gallium arsenide, indium arsenic antimonide, indium gallium arsenide phosphide, indium aluminum gallium arsenide, indium aluminum gallium nitride, indium aluminum gallium antimonide, lead sulfide, cadmium selenide, tin sulfide, cadmium sulfide, zinc selenide, bismuth, and selenium. Other semiconductors, for example those comprising two or more of the elements selected from the group consisting of gallium, arsenic, indium, phosphorus, aluminum, nitrogen, antimony, lead, sulfur, cadmium, selenium, tin, zinc, and bismuth; or otherwise comprising Group 3, 4, or 5 elements, can also be used.

The exemplary source electrode 125 and drain electrode 130 can be made of the same materials suitable for fabrication of the conductive substrate 110 as discussed above.

Figure 3:
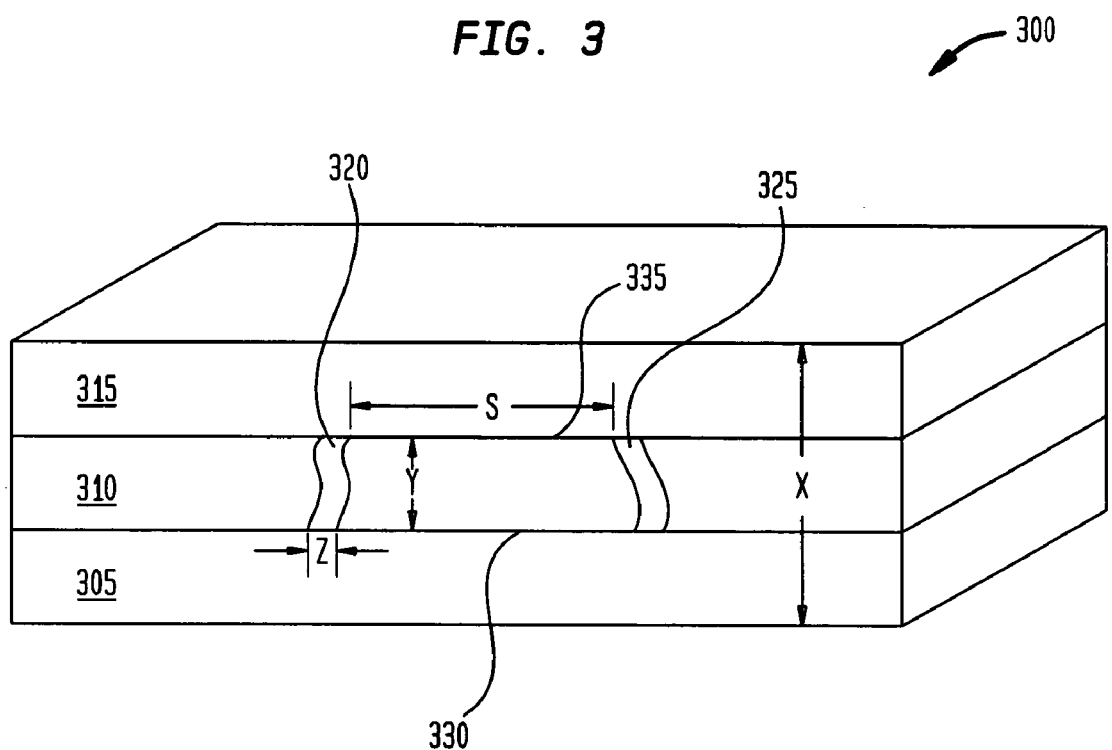
FIG. 3 shows a cross-sectional perspective view of an exemplary capacitor 300 fabricated in accordance with the present invention.

FIG. 3 shows a cross-sectional perspective view of an exemplary capacitor 300 fabricated in accordance with the present invention. The capacitor 300 comprises conductors 305 and 315 interposed by a dielectric layer 310. Interposed dielectric layer 310 electrically isolates the conductors 305 and 315 from each other. The conductors 305 and 315 are in electrical communication with an external circuit, not shown, which can be an integrated circuit for example.

The conductors 305 and 315 are capable of holding electrical charges of opposing polarity in operation of the capacitor 300. In order to properly operate, the capacitor 300 needs to maintain such opposite electrical charges on the respective conductors 305 and 315 with minimized charge dissipation by leakage through the interposed dielectric layer 310. The capacitance of the capacitor 300 is typically proportional to the surface area of the conductors 305 and 315, and inversely proportional to the separation between the conductors. Capacitance further depends linearly on the dielectric constant of the dielectric layer 310 separating the conductors 305 and 315. The overall thickness x of the capacitor 300 desirably is as small as possible in order to maximize capacitance. However, as the thickness y of the dielectric layer 310 itself is reduced in furtherance of raising the capacitance, the potential increases for charge leakage through the dielectric layer 310. In accordance with the present invention, reduction in the thickness of the dielectric layer y is facilitated with such resulting increased capacitance, while maintaining an acceptably low potential for leakage of electrical charges between the conductors across the dielectric layer 310.

Each of the conductors 305 and 315 is fabricated from a conductive material such as a metal, a heavily doped semiconductor, a conductive ceramic, or a conductive polymer. Suitable metals include, for example, aluminum, gold, silver, gallium, indium, platinum, palladium, nickel, titanium, copper, and alloys. Any metal that can, for example, be electroplated, evaporated, cast, electrolessly deposited or sputtered can be used. Conductive ceramics include indium tin oxide, for example. Conductive polymers include, for example, polyaniline and poly(ethylene dioxythiophene), the latter also known as "PEDOT". Each of the conductors 305 and 315 may if desired be formed as a thin layer having an insufficient thickness to be self-supporting.

Dielectric layer 310 may be constituted by the same first dielectric precursor composition as is employed in fabricating the dielectric layer 115 of the TFET 100 discussed above in connection with FIGS. 1 and 2. In one embodiment, the first dielectric precursor composition employed in fabricating the capacitor 300 comprises a material with a high dielectric constant for the purpose of increasing the overall dielectric constant of the resulting dielectric layer 310. In such an embodiment, the high dielectric material may take the form of particulate material suspended in other components, resulting inhomogeneities in the dielectric layer 310. These inhomogeneities may include through holes, which are then remediated as described below. Small pits and bumps generally are inconsequential with regard to the capacitor 300, as the conductors 305 and 315 can be deposited on the dielectric layer 310 despite them.

In another embodiment, the dielectric layer 310 is sufficiently thin and inhomogeneous so that through holes exemplified by through holes 320 and 325 fully extend across the thickness y from the interface 330 between the conductor 305 and the dielectric layer 310, to the interface 335 between the dielectric layer 310 and the conductor 315. In this manner, the thickness of the dielectric layer 310 is minimized to improve the efficiency of manufacture and operation of the capacitor 300. Although the exemplary through holes 320 and 325 fully extend across the thickness y, they have an average diameter exemplified by the diameter z that is substantially smaller than is the average distance s between such through holes. Accordingly, the dielectric layer 310 is a largely continuous material interposed between the conductors 305 and 315 except for discontinuities such as through holes. Further in accordance with this embodiment, a portion of the through holes in the dielectric layer 310, exemplified by through holes 320 and 325, are at least partially blocked at either or both ends by a second dielectric material. The second dielectric material employed in this embodiment can be the same composition as discussed above in connection with FIGS. 1 and 2. The at least partial blockage of such through holes in the dielectric layer 310 commensurately reduces the occurrence of a leakage current flowing between the conductor 305 and the conductor 315. In this manner, the fabrication of a relatively thin dielectric layer 310 is facilitated, because subsequent at least partial blockage of through holes reduces the otherwise excessive resulting leakage current to an acceptable level. Also, a substantially greater density of through holes can be tolerated in the dielectric layer 310.

In one embodiment, the deposition of the second dielectric material is directed to be localized in the through holes exemplified by through holes 320 and 325. Hence, the second dielectric material frequently is deposited at the interface 330 between the conductor 305 and the dielectric layer 310, and at the interface 335 between the dielectric layer 310 and the conductor 315, in discrete, discontinuous and mutually isolated regions. There is thus no continuous film formed of the second dielectric material at either of the interfaces 330 and 335. Accordingly, the second dielectric material adds inconsequentially to the overall average thickness y of the dielectric layer 310. By reference to the phrase "localized in the through holes" is broadly meant that the second dielectric material is positioned to effectively reduce the cumulative electrical communication between the conductor 305 and the conductor 315 via through holes. For example, the second dielectric material may be located in the vicinity of the interface 330 or 335 or both, and within, in the entrance to, or over the entrance to a given through hole.

In one embodiment, the composition of the second dielectric material to be used is selected from dielectric materials, and precursors to dielectric materials, that can be effectively localized in the through holes. For example, localized deposition of the second dielectric material can be induced by applying the conductor 305 to the dielectric layer 310 or vice versa, and then applying an electrical charge to the conductor 305 prior to fabrication of the conductor 315, so that the charge selectively reaches the interface 335 as a leakage current through the exemplary through holes 320 and 325. Alternatively for example, reaction initiators can be provided on the conductor 305 at the interface 330 before fabrication of the dielectric layer 310. Exposure of the reaction initiators at the interface 335 after fabrication of the dielectric layer 310 is limited to localized regions at the interface 330 underlying through holes. Further, reaction initiators can be applied to the interface 335 overlying the dielectric layer 310 prior to fabrication of the conductor 315 and then selectively deactivated, leaving activated initiators located only near through holes. Subsequent deposition of the second dielectric material by any of these exemplary methods accordingly results in selective reaction of the second dielectric material localized in the through holes. The conductor 315 can then be applied onto the dielectric layer 310. The second dielectric precursor composition employed may be selected from the same compositions that were discussed above in connection with FIGS. 1 and 2.

Figure 4:
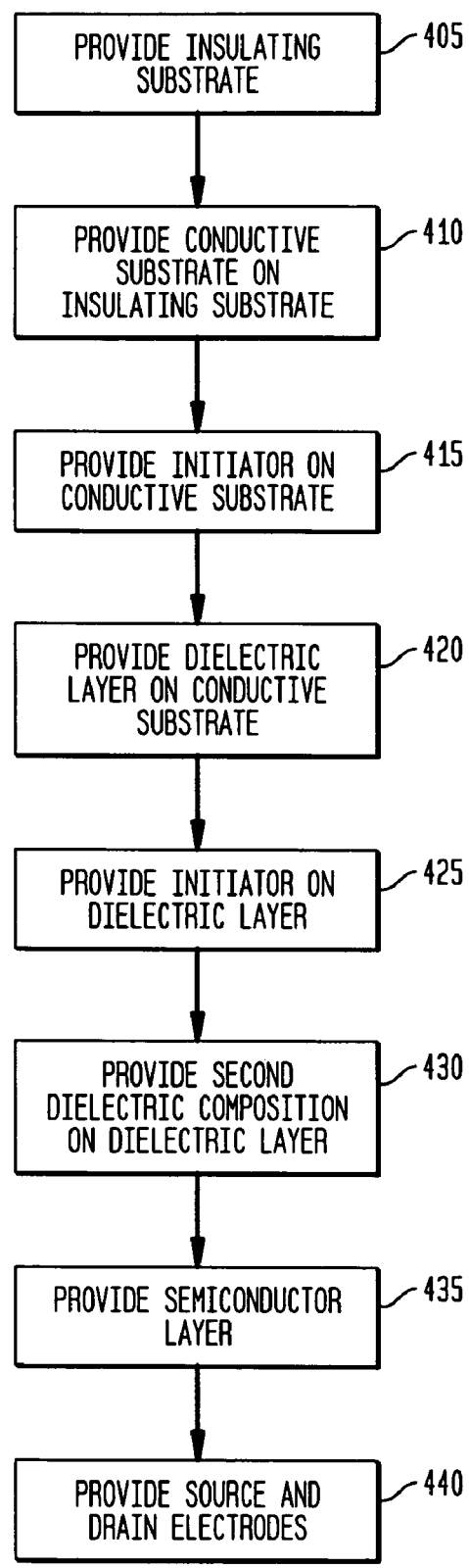
FIG. 4 shows an embodiment of a method 400 for making the TFET shown in FIGS. 1 and 2.

FIG. 4 shows an embodiment of a method 400 for making the TFET 100 shown in FIGS. 1 and 2. In step 405, a suitable insulating substrate 105 is provided. As pointed out earlier, the insulating substrate 105 provides structural support for the conductive substrate 110, and isolates the conductive substrate 110 to prevent undesired dissipation of an electrical charge to be applied to the conductive substrate 110. In one embodiment, the insulating substrate 105 is a prefabricated dielectric material such as a silicon wafer having a silicon dioxide coating, for example. In another embodiment the conductive substrate 110 is self-supporting and is insulated by external means not shown. In this case, the insulating substrate 105 is omitted.

In step 410, the conductive substrate 110 is provided on the insulating substrate 105. In one embodiment, the conductive substrate 110 is constituted by a thin layer of a suitable metal or other conductive material as discussed above, such as gold for example. A thin exemplary layer of gold may be applied to the insulating substrate 105 by any suitable solid, liquid or vapor phase deposition process, such as by sputtering for example. In another embodiment, the conductive substrate 110 is fabricated as a self-supporting sheet material by any suitable process, and the insulating substrate 105 is omitted.

In step 420, the dielectric layer 115 is provided on the conductive substrate 110. The exposed surface of the conductive substrate 110 is first thoroughly cleaned. To produce the dielectric layer 115, the conductive substrate 110 can first be subjected to an aggressive cleaning solution such as a piranha solution. A suitable piranha solution comprises a 2:1 mixture by volume of sulfuric acid (98% by volume, in water) and hydrogen peroxide (30% by volume, in water). Following exposure to the piranha solution for a moderate time, such as about 5 minutes, the conductive substrate 110 is thoroughly washed in deionized ultrapure water. Other conventional methods for thoroughly cleaning the conductive substrate 110 can also be employed.

To produce the dielectric layer 115, a first dielectric precursor composition is then applied to the conductive substrate 110. For example, the selected first dielectric precursor composition may be mobilized by a suitable liquid vehicle and applied to the conductive substrate 110 by surface-initiated growth, spin-coating or casting techniques. In the coating and casting techniques, the dielectric layer 115 is converted into a solid form, for example, by drying, polymerizing and/or curing of the selected coated or cast composition. In one embodiment, the thickness t of the dielectric layer 115 is sufficiently small to provide high capacitance. In one embodiment, the thickness t is selected at a point within a range between about 10 nanometers (nm) and about 2 microns ($\mu$m). In some embodiments, the thickness t is selected to be less than about 1$\mu$m. In a further embodiment, the thickness t is less than about ½ $\mu$m. In an additional embodiment, the average diameter of the through holes in the dielectric layer 115 is within a range between about 1 nm and about 100 nm. In a further embodiment, the average diameter of the through holes is within a range between about 1 nm and about 10 nm. In additional embodiments, the dielectric layer 115 produces a capacitance of at least about 5 nanofarads per square centimeter ($nF/cm^2$), typically at least about 10 $nF/cm^2$, and more typically at least about 20 $nF/cm^2$.

In another embodiment, the selected first dielectric precursor composition comprises particles of a high dielectric material in order to increase the dielectric constant of the resulting dielectric layer 115. In such a case the resulting dielectric layer 115 may be particularly spongy and rough, as the high dielectric particles can cause imperfections. However, the inclusion of the high dielectric material facilitates fabrication of dielectric layers 115 that have an increased thickness t, such as a thickness t of up to about 5 µm, and use of said thick layers in capacitors with high capacitances. In a further embodiment, the thickness t is within a range between about 10 nm and about 2 µm. In other embodiments, the thickness t is selected so that through holes constitute less than about 20% of the surface area of the dielectric layer 115 at the interface 150, typically less than about 10% of said surface area, and more typically less than about 1% of said surface area.

In step 430, the second dielectric precursor composition is selected as discussed above, and is provided on the dielectric layer 115. For example, the selected second dielectric precursor composition may be mobilized by a suitable liquid vehicle and applied to the dielectric layer 115 by spin-coating, casting or immersion. In one embodiment, the second dielectric precursor composition is applied to the dielectric layer 115 in a manner suitable to fill through holes and pits and to smooth out areas surrounding bumps on the dielectric layer 115 at the interface 150, while minimizing retention of the second dielectric precursor composition on other regions of the interface 150 so as to not form a continuous film thereof. As a result, the second dielectric precursor composition is retained on the dielectric layer 115 in the form of discrete, discontinuous and mutually isolated regions.

In one embodiment, the second dielectric precursor composition is selectively retained on the dielectric layer 115 by employing an electrodeposition process. According to this process, the second dielectric precursor composition is applied to the dielectric layer 115 in a form mobilized by a suitable liquid vehicle, such as in a solution, suspension, emulsion or dispersion for example. In one embodiment, the concentration of the second dielectric precursor composition in the liquid vehicle is within a range between about 1% and about 100% by weight. For example, molten phenol can be used. While the second dielectric precursor composition is applied to the dielectric layer 115, an electric current is applied to the conductive substrate 110. In this manner, the electric current selectively penetrates through the dielectric layer 115 via exemplary through holes 135 and 140, reaching the interface 150. The localized electric current then attracts molecules of the second dielectric precursor composition to the entrances to the through holes. Depending on the chemistry of the selected second dielectric precursor composition, the molecules may, for example, then remain electrostatically attracted, become ionized, become polymerized, or become bonded to the through holes. The interface 150 may then be suitably flushed with a fluid such as a solvent, in order to remove molecules of the second dielectric precursor composition that have not been so affected by the electrodeposition current. The second dielectric precursor composition then remains only within and in the vicinity of the exemplary through holes 135 and 140, in discrete, discontinuous and mutually isolated regions so that no continuous layer of the second dielectric precursor composition forms at the interface 150. In another embodiment, the molecules, oligomers or prepolymers of the selected second dielectric precursor composition are provided with charged, oxidizable, or reducible groups to facilitate the selective electrodeposition process. Appropriately charged groups will be attracted to the opposing charge applied to the conductive substrate 110. Oxidizable or reducible groups will be induced to chemically react with each other or with the dielectric layer 115 in the vicinity of the through holes.

For example, phenoxides are anionic groups that become electrically attracted to an oxidizing electrode. Further, phenoxides and phenols are groups that form oxidized intermediates that become fixed to the oxidizing electrodes.

In another embodiment, step 420 is preceded by step 415 in which a reaction initiator is applied to the conductive substrate 110. The reaction initiator is selected for its ability to catalyze or otherwise accelerate the reaction of the selected second dielectric precursor composition with itself or with the dielectric layer. For example, the reaction initiator may initiate the polymerization of the second dielectric precursor composition. The reaction initiator is also selected to not interfere with adherence of the first dielectric precursor composition to the conductive substrate 110 and to not cause its degradation or interfere with the fabrication and functionality of the dielectric layer 115.

The selected reaction initiator is applied by a suitable process to the conductive substrate 110. For example, the selected reaction initiator may be mobilized in a liquid vehicle such as a solution, suspension, emulsion or dispersion or the like and applied to form a thin coating onto the conductive substrate 110. Excess coating material is then removed and the thin coating is allowed to dry. The dielectric layer is then applied in the same manner as discussed above in connection with step 420.

Upon subsequent application of the second dielectric precursor composition in step 430, those portions of the reaction initiator coating that are aligned with exemplary through holes 135 and 140 are exposed to the interface 150. The second dielectric precursor composition is applied to the dielectric layer 115 in the same manner as earlier discussed. The exposed regions of the reaction initiator then interact with the second dielectric precursor composition at the entrances to the exemplary through holes 135 and 140. Reaction of the precursor molecules selectively occurs in the vicinity of the exemplary through holes 135 and 140 at the interface 150. Depending on the chemistry of the reaction initiator and of the precursor molecules, the molecules may then, for example, become ionized, become polymerized, or become bonded to the through holes. The interface 150 may then be suitably flushed with a fluid such as a solvent, in order to remove the precursor molecules that have not been so affected by the reaction initiator. Desirably, the second dielectric precursor composition then remains only within and in the vicinity of the exemplary through holes 135 and 140, in discrete, discontinuous and mutually isolated regions.

In a further embodiment, step 430 is preceded by step 425 in which a reaction initiator is applied to the dielectric layer 115. The reaction initiator is selected for its ability to catalyze or otherwise accelerate the polymerization of the selected second dielectric precursor composition or its reaction with the already formed portion of the dielectric layer 115. For example, the reaction initiator may initiate the polymerization of said precursor molecules. The reaction initiator is also selected to not cause degradation or other interactions that would interfere with the functionality of the dielectric layer 115. In addition, desirably the reaction initiator does not interfere with the application of nor interfere with the functionality of a subsequently applied substrate such as a semiconductor layer.

The selected reaction initiator is applied by a suitable process to the dielectric layer 115. For example, the selected reaction initiator may be mobilized in a liquid vehicle such as a solution, suspension, emulsion or dispersion or the like and applied to form a thin coating onto the dielectric layer 115. Excess coating material is then removed and the thin coating is allowed to dry. The reaction initiator is then selectively deactivated or removed except for regions within the vicinity of exemplary through holes 135 and 140, or selectively activated within the vicinity of or bonded to such through holes.

In one embodiment, an electric current is applied to the conductive substrate 110 following application of the reaction initiator to the dielectric layer 115. In this manner, the electric current selectively penetrates through the dielectric layer 115 via exemplary through holes 135 and 140, reaching the interface 150. The localized electric current then interacts with and for example activates the reaction initiator or causes the reaction initiator to bond to the dielectric layer in the vicinity of the through holes. After the reaction initiator has thus been selectively bonded to the dielectric layer, the interface 150 may then be suitably flushed with a fluid such as a solvent, in order to remove molecules of the reaction initiator that have not been so bonded by the electrodeposition current. Following such flushing, or if instead the reaction initiator is thus selectively activated, then the precursor molecules for the second dielectric precursor composition are then applied in step 430 as discussed above. The remaining or activated regions of the reaction initiator then selectively react with molecules of the second dielectric precursor composition in the vicinity of the exemplary through holes 135 and 140 at the interface 150. Depending on the chemistry of the reaction initiator and of the selected second dielectric precursor composition, the precursor molecules may then for example remain electrostatically attracted, become ionized, become polymerized, or become bonded to the through holes. The interface 150 may then be suitably flushed with a fluid such as a solvent, in order to remove precursor molecules that have not been so affected by the reaction initiator. Desirably, the second dielectric precursor composition then remains only within and in the vicinity of the exemplary through holes 135 and 140, in discrete, discontinuous and mutually isolated regions. There is no layer of the second dielectric precursor composition formed on the dielectric layer 115 at the interface 150.

In another embodiment, the reaction initiator is selectively quenched following the formation of a thin coating of the reaction initiator on the dielectric layer 115. In one embodiment, a suitable process is employed for selectively depositing, over the thin coating of the selected reaction initiator, a composition capable of its deactivation. This deactivator composition coating is selectively applied so that exemplary through holes 135 and 140, exemplary pits 155 and 160, and areas surrounding exemplary bumps 165 and 170 are inadequately coated by the deactivating composition.

For example, a flat stamping surface can be coated with a thin layer of a composition capable of deactivating the reaction initiator. The flat stamping surface is then applied over the thin coating of the reaction initiator. The reaction initiator then remains active only in the vicinity of exemplary through holes 135 and 140, exemplary pits 155 and 160, and the slopes surrounding the peaks of exemplary bumps 165 and 170, none of which can be adequately contacted by the flat surface of the stamp. The second dielectric precursor composition is then applied in step 430 in the manner as discussed above. The activated regions of the reaction initiator then selectively react with molecules of the second dielectric precursor composition in the vicinity of the exemplary through holes, pits and bumps at the interface 150. Depending on the chemistry of the reaction initiator and of the selected second dielectric precursor composition, the molecules, oligomers or prepolymers of the second dielectric precursor composition may then for example become ionized, become polymerized, or become bonded to the through holes, pits and areas surrounding bumps. The interface 150 may then be suitably flushed with a fluid such as a solvent, in order to remove portions of the second dielectric precursor composition that have not been so affected by the reaction initiator. Desirably, the second dielectric precursor composition then remains only within and in the vicinity of the exemplary through holes 135 and 140, the exemplary pits 155 and 160, and the areas surrounding the peaks of exemplary bumps 165 and 170, in discrete, discontinuous and mutually isolated regions. There is no layer of the second dielectric precursor composition formed on the dielectric layer 115 at the interface 150. One advantage of this embodiment is that a rough surface formed by the dielectric layer 115 at interface 150 can be smoothed by reduction of the inhomogeneities of pits and bumps. This embodiment is of particular utility in the subsequent application of semiconductor layer 120, as the maximum size growth potential for semiconductor single crystals is directly proportional to the smoothness of the dielectric layer 115. For example, radical polymerization initiators can be deactivated by radical traps such as 4-tert-butylcatechol and by strong ligands such as primary amines. Further for example, strong acids, bases, and oxidizing agents can be used to deactivate Grubbs catalysts.

In an alternative embodiment, the deactivating composition can be applied by vapor deposition impinging on the interface 150 at an angle so that the deactivating composition cannot penetrate the exemplary through holes 135 and 140 or the exemplary pits 155 and 160.

In step 435, a semiconductor composition is selected and semiconductor layer 120 is applied to the dielectric layer 115. The semiconductor composition can be so applied, for example, by vacuum sublimation, liquid film or spin casting from solution, printing methods, dipping, immersion, or vapor deposition.

In step 440, source electrode 125 and drain electrode 130 are provided on the semiconductor layer 120. For example, a steel shadow mask can be placed over the surface of the semiconductor layer 120, leaving exposed those portions of the surface where the electrodes are to be located. The partially-fabricated device including the semiconductor layer 120 is then placed in a suitable vacuum chamber such as a bell jar, which is then evacuated. A source of gold metal is also placed in the vacuum chamber and heated to vaporize and deposit gold over the shadow mask to produce the source and drain electrodes 125 and 130, respectively.

FIG. 5 shows an embodiment of a method 500 for making the capacitor 300 shown in FIG. 3. In step 510, the conductor 305 is formed, for example on a release substrate from which it can later be removed. In one embodiment, the conductor 305 is constituted by a thin layer of a suitable metal or other conductive material as discussed above, such as gold for example. A thin exemplary layer of gold may be formed on a suitable release substrate by any suitable solid, liquid or vapor phase deposition process, such as by electrodeposition or sputtering for example.

In step 530, the dielectric layer 310 is provided on the conductor 305 in the same manner as discussed above in connection with step 420 of FIG. 4. In another embodiment, step 530 is preceded by step 520 in which a reaction initiator is applied to the conductor 305 in the same manner as discussed above in connection with step 415 of FIG. 4.

In step 550, the second dielectric precursor composition is provided on the dielectric layer 310 in the same manner as discussed above in connection with step 430 of FIG. 4. In a further embodiment, step 550 is preceded by step 540 in which a reaction initiator is applied to the dielectric layer 310 in the same manner as discussed above in connection with step 425 of FIG. 4. In embodiments in which the reaction initiator is selectively quenched following the formation of a thin coating of the reaction initiator on the dielectric layer 310, through holes and pits can be filled and areas surrounding bumps can be smoothed. However, since the exemplary capacitor 300 does not comprise a semiconductor, filling pits and smoothing areas surrounding bumps is generally unnecessary.

In step 560, conductor 315 is formed on the dielectric layer 310. In one embodiment, the conductor 315 is constituted by a thin layer of a suitable metal or other conductive material as discussed above, such as gold for example. A thin exemplary layer of gold may be formed on the dielectric layer 310 by any suitable solid, liquid or vapor phase deposition process, such as by electrodeposition or sputtering for example.

While the present invention has been disclosed in a presently preferred context, it will be recognized that the present teachings may be adapted to a variety of contexts consistent with this disclosure and the claims that follow. For example, the invention may be generally applied to the fabrication of ultrathin dielectric films on substrates having through holes at least partially blocked by a second dielectric material. Such films can be used, for example, as microelectronic devices or as anticorrosive coatings. Further, the invention may be generally applied to the fabrication of any microelectronic device that requires a thin dielectric layer having high capacitance, particularly where both high capacitance and thinness are desirable device features. For example, although the embodiments shown in FIGS. 1–2 and 4 discussed above are all TFETs each employing a single semiconductor layer, other field effect transistor designs comprising two semiconductor layers, for example, can also be employed. Metal oxide semiconductor field effect transistor (MOSFET) designs and junction field effect transistor (JFET) designs, for example, can be employed. Further, the invention may be generally applied to the fabrication of any microelectronic device that requires a thin dielectric layer on a substrate having high capacitance, and which is adapted for use as a substrate for growth of large single semiconductor crystals. For example, diodes and nonvolatile memory devices can be produced in an analogous manner.

We claim:

1. A method of making an apparatus comprising a substrate and a dielectric layer, comprising the steps of:
   providing a substrate;
   providing a dielectric layer comprising a first dielectric material on said substrate, said dielectric layer having a dielectric layer thickness and being traversed by through holes passing from an interface with said substrate, to an opposite side of said dielectric layer;
   providing a reaction initiator on said substrate prior to providing said dielectric layer on said substrate, wherein the providing of said dielectric layer does not deactivate a portion of said reaction initiator located near entrances of said through holes; and
   providing a second dielectric material that reacts with said reaction initiator and which at least partially blocks said through holes.

2. The method of claim 1, further comprising the step of forming a semiconductor layer on said dielectric layer.

3. The method of claim 2, further comprising the step of forming a source electrode and a drain electrode in a spaced apart arrangement on said semiconductor layer.

4. The method of claim 1, in which said providing a dielectric layer produces a layer thickness within a range of between about 10 nanometers and about 5 microns.

5. The method of claim 1, further comprising the step of forming a conductor on said dielectric layer.

6. The method of claim 1, in which the through holes have average diameters substantially smaller than an average spacing between mutually adjacent through holes.

7. A method of making an apparatus comprising a substrate and a dielectric layer, comprising the steps of:
   providing a substrate;
   providing a dielectric layer comprising a first dielectric material on said substrate, said dielectric layer having a dielectric layer thickness and being traversed by through holes passing from an interface with said substrate, to an opposite side of said dielectric layer;
   providing a reaction initiator on said opposite side of said dielectric layer;
   coating a reaction initiator deactivator on said reaction initiator except at regions overlying through holes; and
   providing a second dielectric material that reacts with said reaction initiator at such regions and which then at least partially blocks said through holes.

8. The method of claim 7, in which said dielectric layer comprises pits and bumps that produce surface roughness in one surface of said dielectric layer, wherein said deactivator leaves said reaction initiator uncoated at pits and bumps, and wherein said second dielectric material at least partially fills said pits and at least partially smoothes areas surrounding said bumps in a manner that reduces said roughness.

9. The method of claim 7, in which said step of coating said deactivator comprises the step of transferring said deactivator from a flat stamping surface onto said reaction initiator.

10. The method of claim 7, further comprising the step of forming a semiconductor layer on said dielectric layer.

11. The method of claim 10, further comprising the step of forming a source electrode and a drain electrode in a spaced apart arrangement on said semiconductor layer.

12. The method of claim 7, in which said dielectric layer comprises pits and bumps that produce surface roughness in one surface of said dielectric layer, and wherein said second dielectric material at least partially fills said pits and at least partially smoothes areas surrounding said bumps in a manner that reduces said roughness.

13. The method of claim 7, in which said providing a dielectric layer produces a layer thickness within a range of between about 10 nanometers and about 5 microns.

14. The method of claim 7, further comprising the step of forming a conductor on said dielectric layer.

15. A method of making an apparatus comprising a substrate and a dielectric layer, comprising the steps of:
   providing a substrate;
   providing a dielectric layer comprising a first dielectric material on said substrate, said dielectric layer having a dielectric layer thickness and being traversed by through holes passing from an interface with said substrate, to an opposite side of said dielectric layer; and
   providing a second dielectric material on said opposite side of said dielectric layer; and
   applying an electric field to said substrate to cause said second dielectric material to at least partially block said through holes.

16. The method of claim 15, further comprising the step of forming a semiconductor layer on said dielectric layer.

17. The method of claim 16, further comprising the step of forming a source electrode and a drain electrode in a spaced apart arrangement on said semiconductor layer.

18. The method of claim 15, in which said providing a dielectric layer produces a layer thickness within a range of between about 10 nanometers and about 5 microns.

19. The method of claim 15, further comprising the step of forming a conductor on said dielectric layer.

20. The method of claim 15, in which the through holes have average diameters substantially smaller than an average spacing between mutually adjacent through holes.

* * * * *